United States Patent
Dhong et al.

[11] Patent Number: 6,161,164
[45] Date of Patent: Dec. 12, 2000

[54] CONTENT ADDRESSABLE MEMORY ACCESSED BY THE SUM OF TWO OPERANDS

[75] Inventors: Sang Hoo Dhong; Joel Abraham Silberman, both of Austin, Tex.

[73] Assignee: International Business Machines Corp., Armonk, N.Y.

[21] Appl. No.: 08/716,817

[22] Filed: Sep. 16, 1996

[51] Int. Cl.[7] .............................. G06F 12/00; G06F 7/00; G11C 15/00

[52] U.S. Cl. ........................... 711/108; 365/49; 708/553; 708/603; 711/220

[58] Field of Search ................................... 711/207, 114, 711/108, 125, 220; 365/49; 708/553, 603

[56] References Cited

U.S. PATENT DOCUMENTS

| | | | |
|---|---|---|---|
| 4,918,642 | 4/1990 | Chang | 708/710 |
| 5,020,016 | 5/1991 | Nakano et al. | 364/736.5 |
| 5,226,005 | 7/1993 | Lee et al. | 365/49 |
| 5,333,117 | 7/1994 | Ha et al. | 708/191 |
| 5,339,268 | 8/1994 | Machida | 365/49 |
| 5,396,449 | 3/1995 | Atallah et al. | 365/49 |
| 5,469,378 | 11/1995 | Albon et al. | 365/49 |
| 5,491,703 | 2/1996 | Barnaby et al. | 371/40.1 |
| 5,508,950 | 4/1996 | Bosshart et al. | 364/736.5 |
| 5,592,634 | 1/1997 | Circello et al. | 395/586 |
| 5,600,583 | 2/1997 | Bosshart et al. | 364/736.5 |
| 5,644,521 | 7/1997 | Simpson | 708/525 |
| 5,742,539 | 4/1998 | Kinugasa et al. | 365/49 |
| 5,745,397 | 4/1998 | Nadahara | 364/745.3 |
| 5,798,958 | 8/1998 | Wong | 364/768 |
| 5,812,521 | 9/1998 | Levenstein et al. | 708/701 |
| 5,875,121 | 2/1999 | Yetter | 365/195 |

OTHER PUBLICATIONS

"An Evaluation of Asynchronous Addition". D. J. Kinniment, IEEE Transactions on very Large Scale Integration (VLSI) Systems, pp. 137–140, Mar. 1996.

"Evaluating A+B=K Conditions in Constant Time", J. Cortadella et al., IEEE Transactions, pp. 243–246, 1988.

Yung–Hei Lee et al., "Address Addition and Decoding without Carry Propagation", IEICE Trans. Inf. & Syst., vol. E80–D, No. 1, Jan. 1997, pp. 98–100.

Parhami, Behrooz, "Comments on 'Evaluation of A+B=K Conditions Without Carry Propagation'," *IEEE Transactions on Computers*, vol. 43, No. 4, Apr. 1994, p. 381.

Cortadella, Jordi, et al., "Evaluation of A+B=K Conditions Without Carry Propagation," *IEEE Transactions on Computers*, vol. 41, No. 11, Nov. 1992, pp. 1484–1488.

*Primary Examiner*—John W. Cabeca
*Assistant Examiner*—Pierre-Michel Bataille
*Attorney, Agent, or Firm*—Kelly K. Kordzik; Winstead Sechrest & Minick P.C.; Casimer Slays

[57] ABSTRACT

Within a content addressable memory, the latency in a memory access is reduced by combining the steps of effective address generation addition and searching within the content-addressable memory. Two inputs to the content-addressable memory are conditioned and then supplied to matching cells, which determine which address stored in the content-addressable memory will be output. This is accomplished without a full adder being implemented to add the two input operands before being supplied to the content-addressable memory.

26 Claims, 5 Drawing Sheets

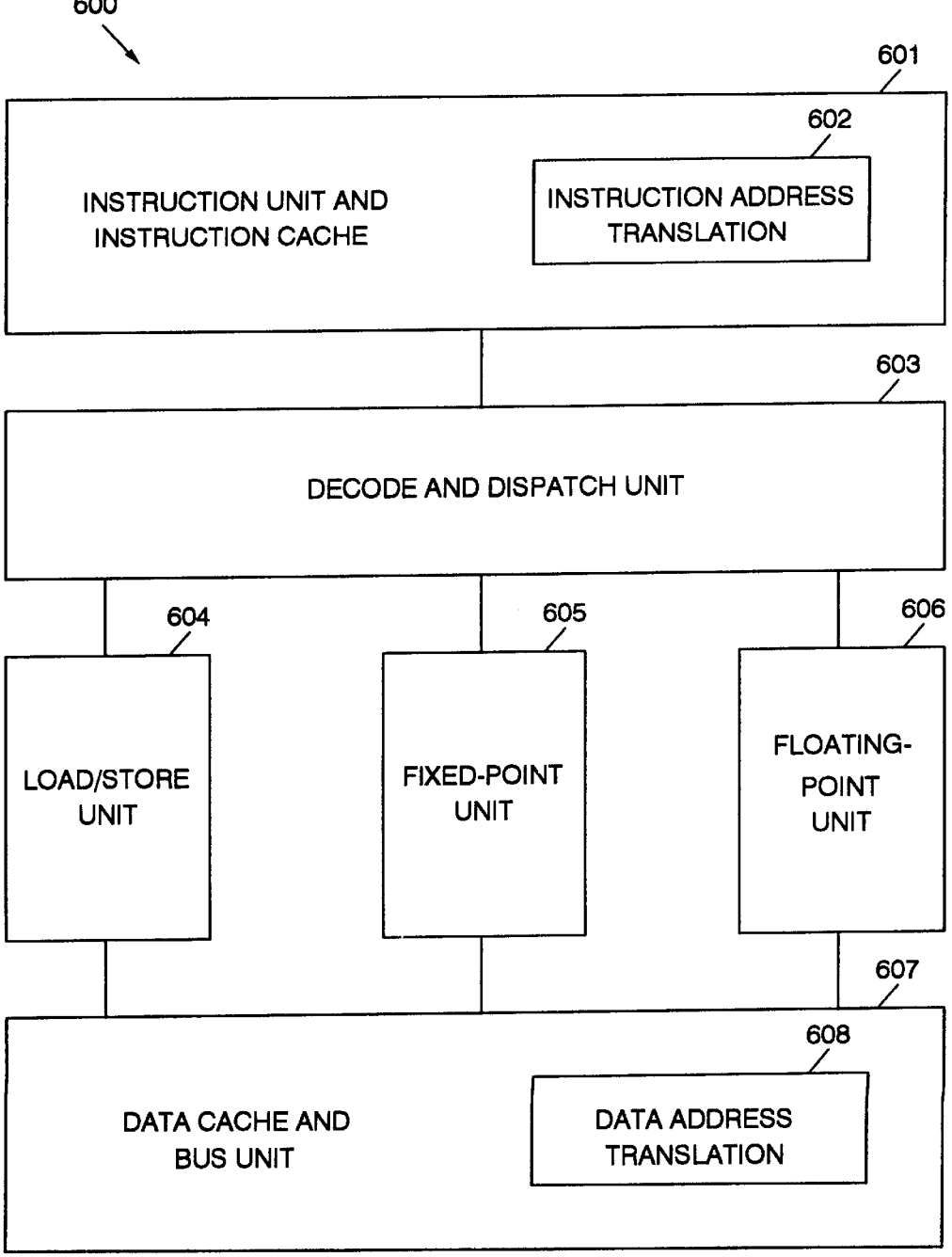

CONTENT ADDRESSABLE MEMORY ACCESSED BY THE SUM OF TWO OPERANDS

TECHNICAL FIELD

The present invention relates in general to data processing systems, and in particular, to translation of effective addresses into real addresses using a content addressable memory.

BACKGROUND INFORMATION

In the course of a memory access by a microprocessor, two steps occur. First, an effective address is generated by the program code, and then this address is translated to the real or physical address of a location in memory. Effective address generation most often involves the addition of two operands. In a 64-bit machine, for example, two 64-bit numbers are added to generate a 64-bit effective address. Because translation of the effective address to a real address can take several machine cycles, various caching structures such as the Segment Lookaside Buffer ("SLB") and Translation Lookaside Buffer ("TLB") are employed to speed up the translation process. To assist translation, many of these structures to assist translation rely on a content-addressable memory ("CAM") to store an association between all or part of the effective address and a datum or real address that would be produced in translation.

The current practice of generating an effective address and using this to access a CAM is illustrated in FIG. 2. N-bit adder 201 receives operands A and B, which are added by adder 201 to produce a result A+B, which is then supplied to CAM 200. The matching cells portion of CAM 200 determines whether or not there is an entry K equal to N. If so, then entry K is used within the associated data portion of CAM 200 to output a corresponding real address M.

One problem with the prior art process for producing a real address using CAM 200 is that adder 201 requires a significant amount of cycle time in order to produce the sum resulting in an unacceptable latency factor during a memory access process. As a result, there is a need in the art for an improved process for translating effective addresses into real addresses.

SUMMARY OF THE INVENTION

The present invention addresses the foregoing need by combining the steps of effective address generation addition and searching of a CAM to reduce the latency of a memory access process. A CAM is accessed by the two operands A and B into an input processing cell and a specialized matching cell within the CAM.

The present invention may be implemented within a CAM comprising circuitry for receiving first and second numbers (A and B), circuitry for determining if A+B matches with a third number K stored in the CAM without actually adding A and B together, and circuitry for using K to select and output a fourth number from the CAM. This may be accomplished by producing a redundant representation of A+B.

The present invention may also be implemented as a method for operating a CAM, including the steps of receiving first and second numbers, A and B, determining if A+B matches with a third number K stored in the CAM, without actually adding A and B together, and using the third number to select and output a fourth number from the CAM.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWING

For a more complete understanding of the present invention, and the advantages thereof, reference is now made to the following descriptions taken in conjunction with the accompanying drawings, in which:

FIG. 6 illustrates microprocessor configured in accordance with the present invention.

DETAILED DESCRIPTION

Figure 1:
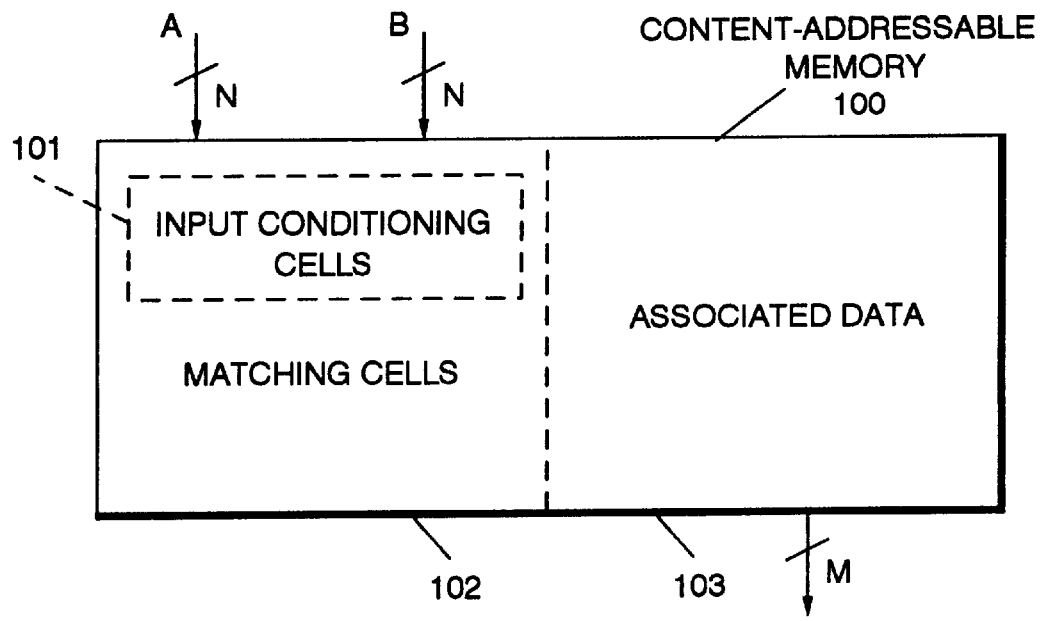
FIG. 1 illustrates a CAM configured in accordance with the present invention.
Figure 2:
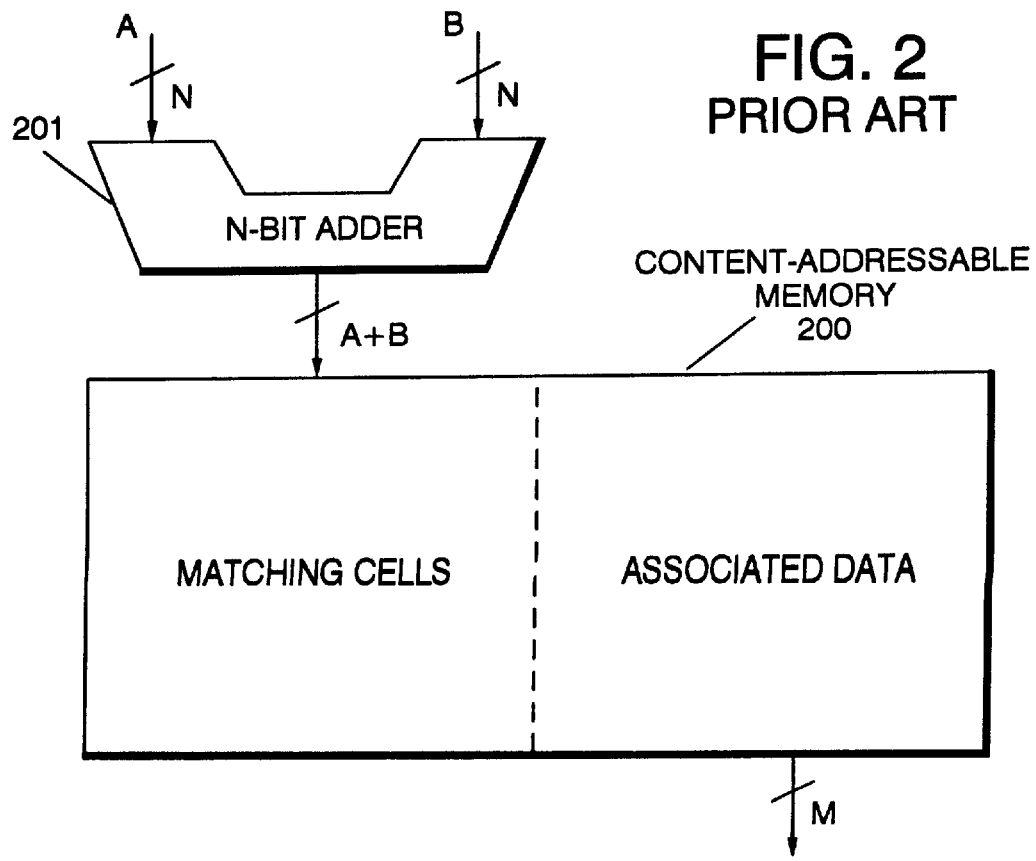
FIG. 2 illustrates a prior art CAM for translating effective addresses into real addresses.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

In the following discussion, these symbols are representative of the corresponding logical operations.

+ addition

• AND

∨ OR

⊕ XOR.

This disclosure describes a means of combining the steps of effective address generation addition and searching of a content-addressable memory ("CAM") to reduce the latency in memory access. The new organization is depicted in FIG. 1, which shows CAM 100 accessed by two inputs (operands) A and B. The structure consists of input processing cell 101 and specialized matching cells 101 in CAM 100. The two components together enable selection of an entry whose content is K if A+B=K holds for the input operands.

The problem of adding A+B and testing to determine if A+B=K in a fast way was addressed by J. Cortadella and M. Llaberia, Evaluation of A+B=K Conditions Without Carry Propagation, *IEEE Trans, Comput.*, vol. 41, no. 11, pp. 1484–1488, November 1992 and B. Parhami, Comments on 'Evaluation of A+B=K Conditions Without Carry Propagation', *IEEE Trans. Comput.*, vol. 43, no. 4, p. 381, April 1994, which are hereby incorporated by reference herein. The problem is recast as A+B−K=0, and, with 2's complement n-bit numbers, becomes A+B−$\overline{K}$=−1, where $\overline{K}$ is the complement of K. One can use an n-bit carry-save adder to reduce A+B+$\overline{K}$ to two n-bit numbers S and C (sum and carry; also referred to as being in a redundant form) satisfying A+B+$\overline{K}$=S+C. Then one can test if A+B=K by forming S and C as above and testing if S+C=−1 (an n-bit vector of all 1's), or S=$\overline{C}$. Use of a carry-save adder to produce S and C instead of performing a full addition of A and B greatly speeds the process of comparing A+B to K, reducing the delay for the process to that of n parallel full adders, n parallel XOR gates (to compare each bit of S and $\overline{C}$) and an n-bit AND gate. The parallel full adders replace an n-bit binary adder.

This procedure forms the basis of a content-addressable memory accessed by A+B. With K stored in the CAM array, however, it is too "expensive" (i.e., speed of operation and silicon area) to duplicate the full adder for each bit of each entry in the CAM array in order to calculate A+B+$\overline{K}$=S+C. Instead, the process is modified to keep the CAM array small.

With the procedure outlined above, the i'th carry-save adder takes an input $A_i$, $B_i$ and $\overline{K}_i$ and produces $S_i$ and $C_i$. The exclusive OR of $S_i$ and $C_{i+1}$ is then computed and ANDed for all i to determine a match. Very often in CAMs, it is more efficient to determine if any mismatch occurs between the input and stored data rather than test for equality of all input and stored bits. All but perhaps one entry will signal a mismatch, in this case, and strobing is used to invert the logic to find the one that did not mismatch. Under this circumstance, the test for inequality is ORing of $\overline{S_i \oplus C_{i+1}}$, the complement of the exclusive OR of $S_i$ and $C_{i+1}$. The key to making a CAM accessed by A+B is to recast the logical expression for a mismatch in a single bit $Z_i = \overline{S_i \oplus C_{i+1}}$ in a suitable form.

From $A_i + B_i + \overline{K}_i = S_i + C_i$,
$S_i = A_i \oplus B_i \oplus \overline{K}_i = K_i \cdot (A_i \oplus B_i) \vee \overline{K}_i \cdot \overline{(A_i \oplus B_i)}$ and
$C_i = A_i \cdot B_i \vee \overline{K}_i \cdot (A_i \vee B_i)$, one can derive an expression for $Z_i = \overline{S_i \oplus C_{i+1}}$ of the form $Z_i = K_i \cdot K_{i+1} \cdot M_{11}{}^i \vee K_i \cdot \overline{K}_{i+1} \cdot M_{10}{}^i \vee \overline{K}_i \cdot K_{i+1} \cdot M_{01}{}^i \vee \overline{K}_i \cdot \overline{K}_{i+1} \cdot M_{00}{}^i$,
where
$M_{11}{}^i = \overline{(A_i \oplus B_i)} \cdot (A_{i+1} \vee B_{i+1}) \vee (A_i \oplus B_i) \cdot (A_{i+1} \cdot B_{i+1})$,
$M_{10}{}^i = (A_i \oplus B_i) \cdot (A_{i+1} \vee B_{i+1}) \vee \overline{(A_i \oplus B_i)} \cdot (A_{i+1} \cdot B_{i+1})$,
$M_{01}{}^i = (A_i \oplus B_i) \cdot \overline{(A_{i+1} \cdot B_{i+1})} \vee \overline{(A_i \oplus B_i)} \cdot (A_{i+1} \cdot B_{i+1})$, and
$M_{00}{}^i = \overline{(A_i \oplus B_i)} \cdot (A_{i+1} \vee B_{i+1}) \vee (A_i \oplus B_i) \cdot (\overline{A_i} + 1 \cdot \overline{B}_{i+1})$.

The procedure for accessing with A+B CAM 100 that stores K consists of forming the four signals $M_{jk}{}^i$ per bit as above, decoding each pair of bits of K stored in CAM 100 and ORing all $Z_i$ computed as above for each bit i in the word K to determine if any bit yields a mismatch. The circuitry to implement this approach is illustrated in a gate level diagram for input processing cell 101 (FIG. 3) and CAM matching cell 102 (FIG. 4).

Figure 3:
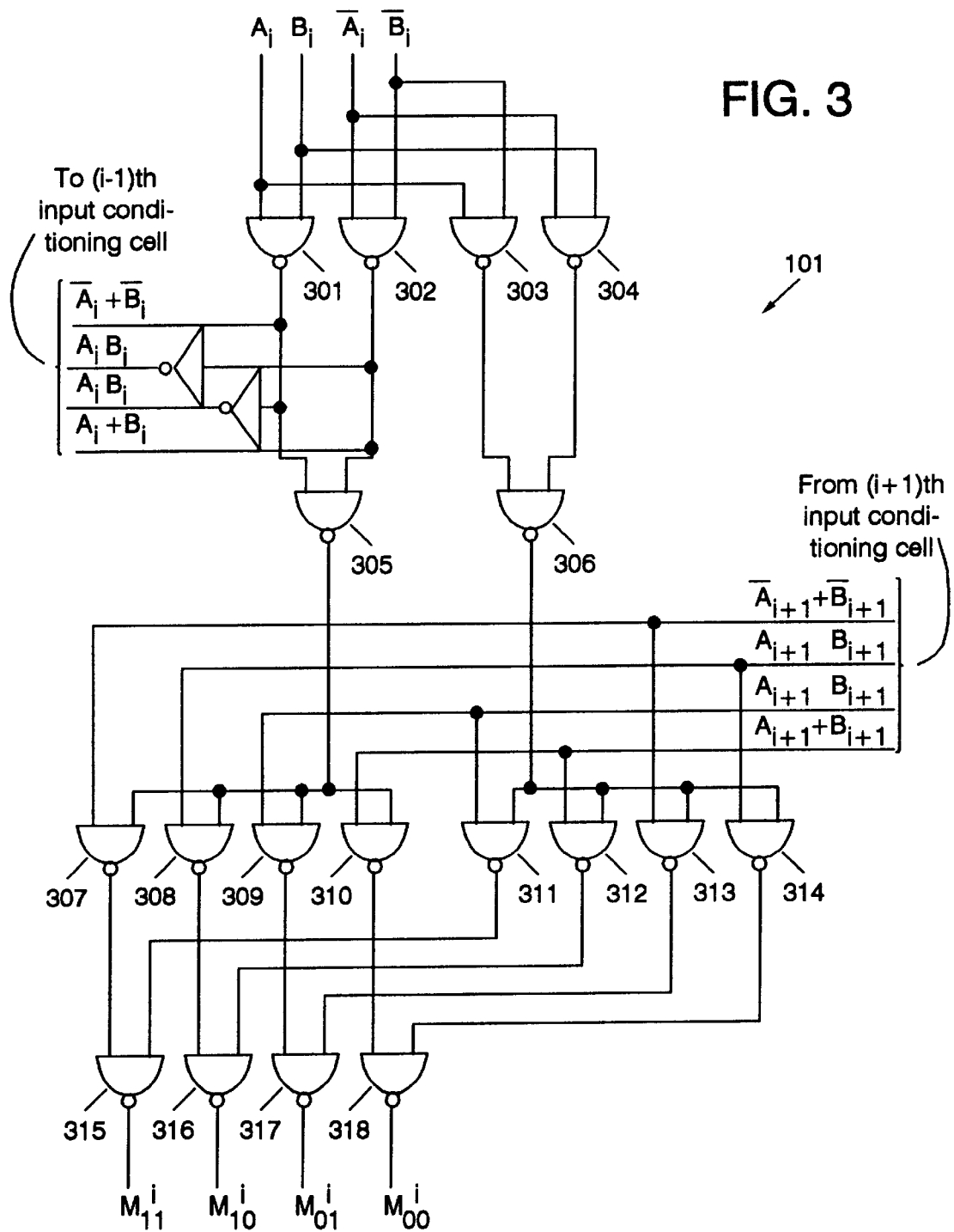
FIG. 3 illustrates a gate level diagram of an input conditioning cell configured in accordance with the present invention.

In FIG. 3, NAND gates 301–304 receive various combinations of the ith bits of operands A and B and their complements $\overline{A}$ and $\overline{B}$. Outputs from NAND gates 301 and 302 are supplied to the (i−1)th conditioning cell (not shown). Outputs from NAND gates 303 and 304 are supplied to NAND gate 306. Thereafter, the outputs of NAND gates 305 and 306 and various illustrated combinations of the (i+1)th A and B operands from the (i+1)th input conditioning cell (not shown) are received by the illustrated combination of NAND gates 307–318 to produce $M_{00}{}^i$, $M_{01}{}^i$, $M_{11}{}^i$, $M_{10}{}^i$.

One skilled in the art can appreciate that other combinations of logic circuitry could be utilized to produce these signals.

Figure 4:
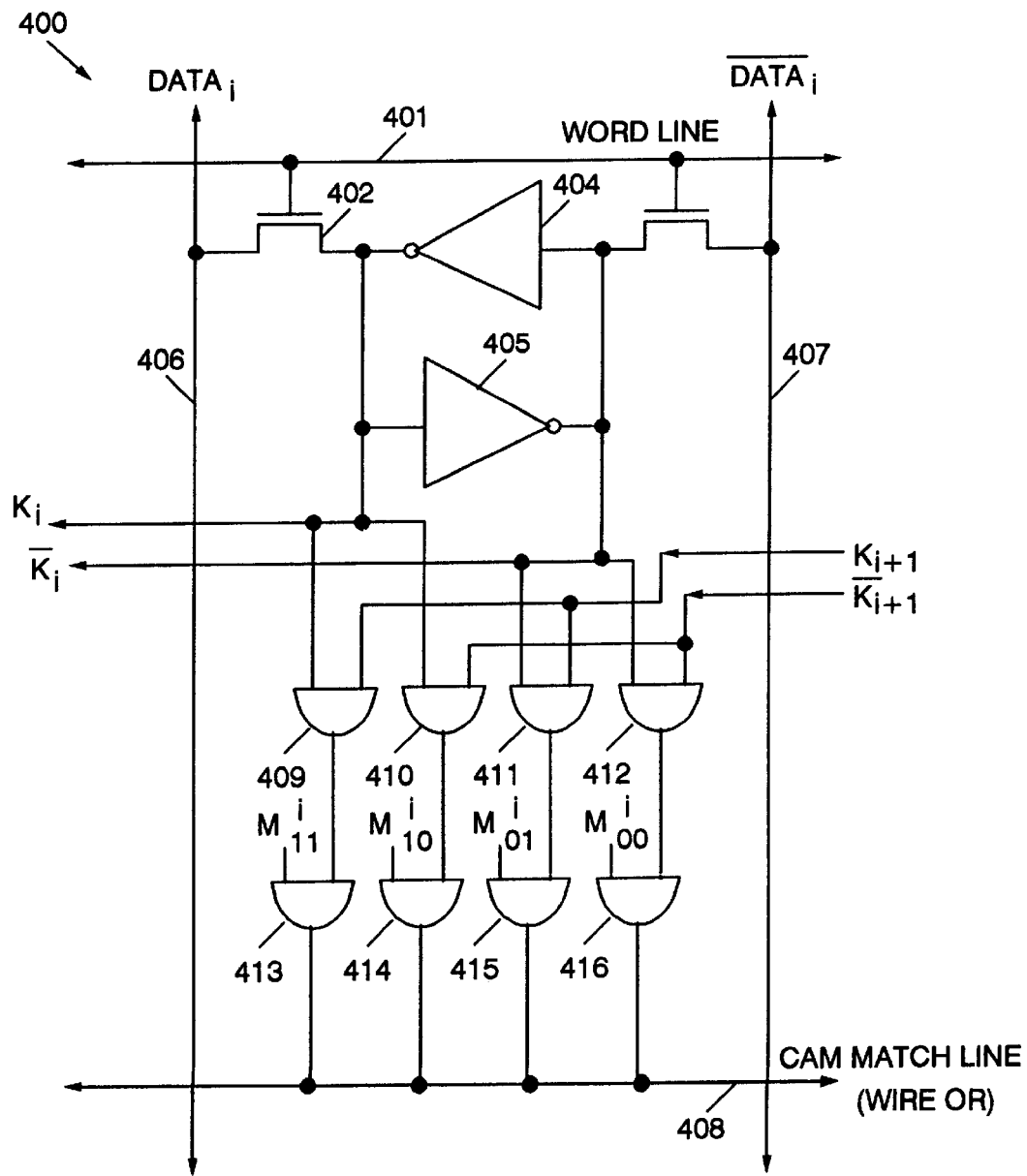
FIG. 4 illustrates a CAM cell configured in accordance with the present invention.

Referring next to FIG. 4, there is illustrated CAM cell 400 configured in accordance with he present invention. As is typically found within a CAM cell, CAM cell 400 includes word line 401, data line 406 and its complement 407, transmission gates 402 and 403 and the storage cell comprising inverters 404 and 405.

The bit value and its complement stored in CAM cell 400 is transmitted to an adjoining CAM cell as values $K_i$ and $\overline{K}_i$, while such K values from the other adjoining CAM cell (i+1) are received by AND gates 409–412 as shown. AND gates 409–412 also receive the K values of CAM cell 400 in the manner illustrated.

The outputs from AND gates 409–412 are received by AND gates 413–416, respectfully, which also receive the signals outputted from NAND gates 315–318 of FIG. 3. The outputs of AND gates 413–416 are provided to CAM match line 408. If on CAM match line 408, which is coupled to each bit within an entry in the CAM, the CAM match line value is a "0," then that entry within the CAM is equal to K. This entry will then be used within the associated data section 100 to output an entry M.

Figure 5:
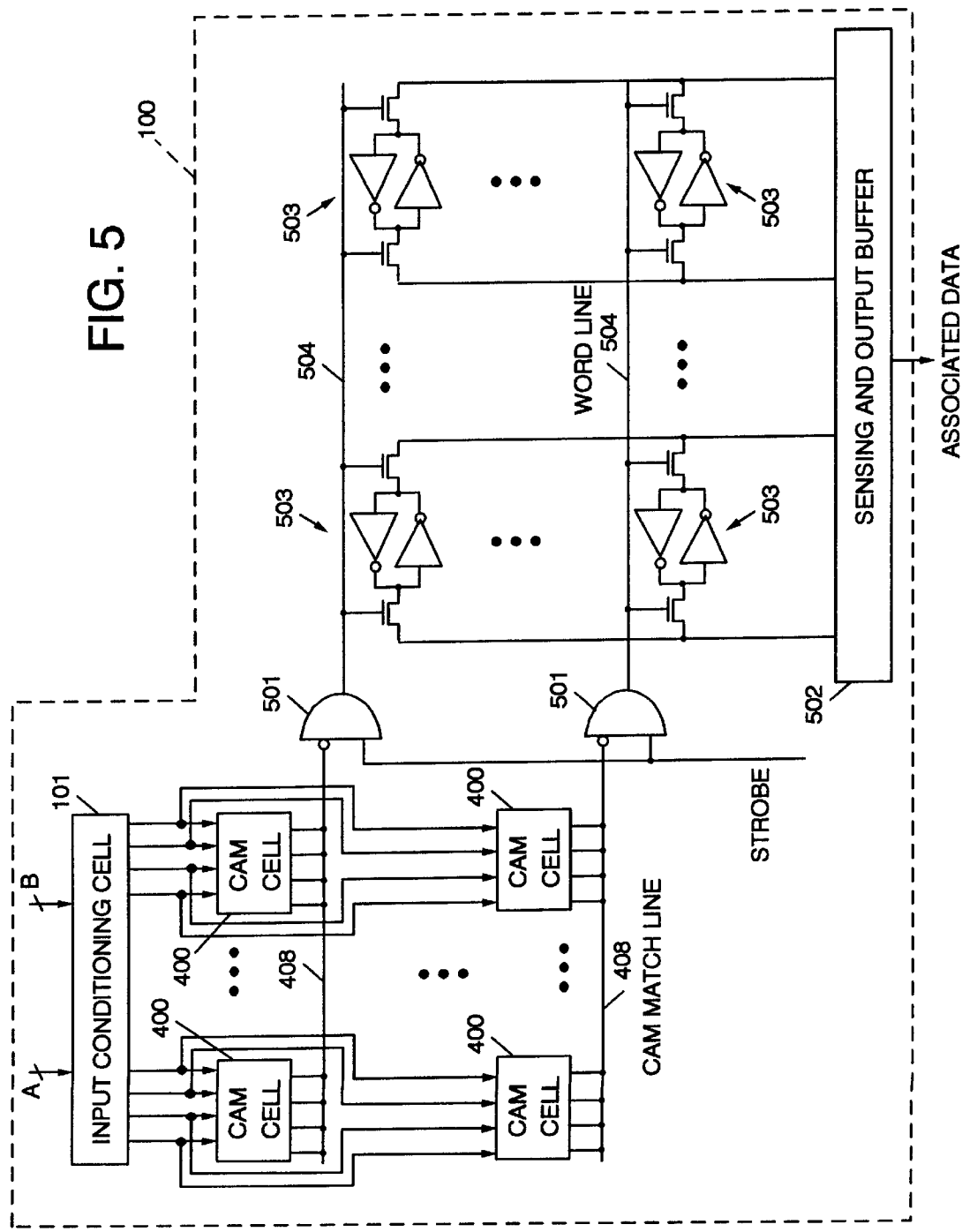
FIG. 5 illustrates further detail of a CAM in accordance with the present invention.

Referring next to FIG. 5, there is illustrated CAM 100 in further detail. Each of CAM match lines 408 are coupled into a negated input of an AND gate 501, which also receives a strobe signal. The outputs of these AND gates 501 with the one negated input are word lines 504 for accessing memory cells 503.

As a result, should any one CAM match line 408 have a negated or "low" signal, then its corresponding AND gate 501 will output an asserted or "high" signal onto the connected word line 504, which will result in the output from the corresponding memory cells 503 into the sensing and output buffer 502, which correspondingly outputs the selected address from CAM 100.

Referring next to FIG. 6, there is illustrated portions of microprocessor 600. Microprocessor 600 includes instruction unit and instruction cache 601, instruction address translation 602, decode and dispatch unit 603, load/store unit 604, fixed-point unit 605, floating-point unit 606, data cache and bus unit 607, and data address translation 608. Such circuitry is common within microprocessors and microcontrollers, such a the PowerPC microprocessor manufactured by International Business Machines, Inc. CAM 100 may be implemented within either or both of instruction address translation 602 and data address translation 608.

An advantage of the present invention is that the circuitry to generate the $M_{jk}{}^i$ can be located in one place. Only the minimal circuitry to decode bit pairs of K and perform the ANDing involved in generating $Z_i$ is replicated for each CAM entry, keeping the hardware cost small. The latency of address generation and CAM lookup is reduced to only a few gate delays more than the CAM lookup delay itself by this method, and it avoids full binary addition of A and B.

Very often in address translation, only L out of the N bits of an effective address are used to access a CAM array. A small modification to the approach described above is required to handle this situation. In the case considered so far, one could work with the sum of A and B expressed in redundant form by S and C without a loss of information. Representing the most significant L bits of A+B by forming S and C from the L most significant bits of A and B omits information about any carry generated in the less significant part of the sum. The procedure based on S and C can be applied to an L bit subset of the N bits if the carry into the least significant of the L bits is explicitly included.

In particular, the matching criterion discussed above can be applied directly to the L−1 most significant bits of the L bits that are to be compared. The method of computing the $M_{jk}^i$ can be used to implement the matching test for these bits. For a complete L-bit match, one imposes the further criterion that the carry in must be the complement of the sum of the least significant of the L bits of A, B, and $\overline{K}$.

By way of example consider the 9-bit number A and B and their sum A+B:

$$A = 010111010$$
$$\underline{B = 001101110}$$
$$A + B = 100101000$$

The most significant 5 bits of the sum matches the 5-bit value K=10010. Using the formulation of testing for a match by constructing S and C from the 5 most significant bits of A, B, and $\overline{K}$, one computes the following values:

$$A = 01011$$
$$B = 00110$$
$$\underline{\overline{K} = 01101}$$
$$S = 00000$$
$$C = 1111C_{in}$$

Since the condition for A+B=K for these 5 bits is that S=C, one observes that the method correctly indicates a match for the 4 most significant bits, and that a complete match requires $C_{in}=1$. Thus the approach outlined previously can be extended to the important case of matching L out of N bits if the carry into this bit group is treated correctly.

Because $C_{in}$ can be either 0 or 1, the remaining L−1 bits of A+B can potentially match two L-bit entries in the CAM that differ only in the least significant bit. The CAM must be constructed to reflect this possibility. If the value K and K+1 are frequently found together in the CAM, the associated data for each entry can be accessed simultaneously with a match on the L−1 most significant bits of K and a selection between the two cases made outside the CAM by $C_{in}$. If it is rare that two entries differing by 1 reside in the CAM, an explicit prohibition of such a condition can be enforced. A third alternative is attractive if $C_{in}$ is known early enough; $C_{in} \oplus S_{L-1}$ can be ANDed with the match signal prior to selecting the data associated with the matching entry in the CAM array.

Although the present invention and its advantages have been described in detail, it should be understood that various changes, substitutions and alterations can be made herein without departing from the spirit and scope of the invention as defined by the appended claims.

What is claimed is:

1. A content addressable memory ("CAM") comprising:
   circuitry for receiving first and second numbers, A and B,
   circuitry for determining if A+B matches with a third number K stored in said CAM without adding A and B together; and
   circuitry for using K to select and output a fourth number from said CAM,
   wherein said third number K is not predetermined to be of a specific single value,
   wherein said third number K is not known before the determination if A+B matches with the third number K stored in said CAM without adding A and B together, and
   wherein K may have any one of $2^N$ possible values, wherein K is an N-bit number.

2. The CAM as recited in claim 1, wherein said determining circuitry further comprises circuitry for producing a redundant representation of A+B.

3. The CAM as recited in claim 1, wherein A+B represents a binary addition of A and B.

4. The CAM as recited in claim 1, wherein said determining circuitry further comprises:
   circuitry for encoding A and B into a plurality of M bits, which are a redundant representation of A+B; and
   circuitry for comparing said M bits with K to determine if there is a match.

5. The CAM as recited in claim 1, wherein said CAM is utilized in an address translation circuit in a processor.

6. A content addressable memory ("CAM") comprising:
   circuitry for receiving first and second numbers, A and B;
   circuitry for determining if A+B matches with a third number K stored in said CAM without adding A and B together; and
   circuitry for using K to select and output a fourth number from said CAM,
   wherein said determining circuitry further comprises:
      circuitry for encoding A and B into a plurality of M bits, which are a redundant representation of A+B; and
      circuitry for comparing said M bits with K to determine if there is a match,
      wherein A, B, and K have i+1 bits each, wherein said determining circuitry further comprises for each bit i,
         circuitry for computing said plurality of M bits as a function of $A_i$, $B_i$, $A_{i+1}$, $B_{i+1}$, and their complements.

7. The CAM as recited in claim 6, wherein said comparing circuitry further comprises:
   circuitry for ANDing said plurality of M bits with logical combinations of $K_i$ and $K_{i+1}$ and their complements.

8. The CAM as recited in claim 6, wherein the computing circuitry further comprises:
   a first NAND gate receiving $A_i$ and $B_i$;
   a second NAND gate receiving the complements of $A_i$ and $B_i$;
   a third NAND gate receiving $A_i$ and the complement of $B_i$;
   a fourth NAND gate receiving $B_i$ and the complement of $A_i$;
   a fifth NAND gate receiving outputs of the first and second NAND gates;
   a sixth NAND gate receiving outputs of the third and fourth NAND gates;
   a seventh NAND gate receiving a sum of a complement of $A_{i+1}$ and a complement of $B_{i+1}$ and an output of the fifth NAND gate;
   an eighth NAND gate receiving a logical AND of $A_{i+1}$ and $B_{i+1}$ and an output of the fifth NAND gate;
   a ninth NAND gate receiving the logical AND of $A_{i+1}$ and $B_{i+1}$ and the output of the fifth NAND gate;
   a tenth NAND gate receiving a sum of $A_{i+1}$ and $B_{i+1}$ and the output of the fifth NAND gate;
   an eleventh NAND gate receiving the logical AND of $A_{i+1}$ and $B_{i+1}$ and an output of sixth NAND gate;
   a twelfth NAND gate receiving the sum of $A_{i+1}$ and $B_{i+1}$ and the output of the sixth NAND gate;
   a thirteenth NAND gate receiving the sum of the complement of $A_{i+1}$ and the complement of $B_{i+1}$ and the output of the sixth NAND gate;

a fourteenth NAND gate receiving the logical AND of $A_{i+1}$ and $B_{i+1}$ and the output of the sixth NAND gate;

a fifteenth NAND gate receiving outputs of the seventh and eleventh NAND gates;

a sixteenth NAND gate receiving outputs of the eighth and twelfth NAND gates;

a seventeenth NAND gate receiving outputs of the ninth and thirteenth NAND gates; and an eighteenth NAND gate receiving outputs of the tenth and fourteenth NAND gates, wherein the fifteenth, sixteenth, seventeenth, and eighteenth NAND gates output the plurality of M bits.

9. In a microprocessor, a method for operating a content addressable memory ("CAM") comprising the steps of:

receiving first and second numbers, A and B, determining if A+B matches with a third number K stored in said CAM without adding A and B together, and using K to select and output a fourth number from said CAM, wherein said third number K is not predetermined to be of a specific single value, wherein said third number K is not known before the determination if A+B matches with the third number K stored in said CAM without adding A and B together, and wherein K may have any one of $2^N$ possible values, wherein K is an N-bit number.

10. The method as recited in claim 9, wherein said determining step further comprises the step of producing a redundant representation of A+B.

11. The method as recited in claim 9, wherein A+B represents a binary addition of A and B.

12. The method as recited in claim 9, wherein said determining step further comprises the step of:

encoding A and B into a plurality of M bits, which are a redundant representation of A+B; and comparing said M bits with K to determine if there is a match.

13. In a microprocessor, a method for operating a content addressable memory ("CAM") comprising the steps of:

receiving first and second numbers, A and B, determining if A+B matches with a third number K stored in said CAM without adding A and B together, and using K to select and output a fourth number from said CAM, wherein said determining step further comprises the step of:

encoding A and B into a plurality of M bits, which are a redundant representation of A+B, and comparing said M bits with K to determine if there is a match, wherein A, B, and K have i+1 bits each, wherein said determining step further comprises the step of:

for each bit i, computing said plurality of M bits as a function of $A_i$, $B_i$, $A_{i+1}$, $B_{i+1}$ and their complements.

14. The method as recited in claim 13, wherein said comparing step further comprises the step of:

ANDing said plurality of M bits with logical combinations of $K_i$ and $K_{i+1}$ and their complements.

15. The method as recited in claim 14, wherein said CAM is utilized in an address translation circuit in a processor.

16. A microprocessor comprising:

an instruction unit including an instruction address translation circuit;

a dispatch unit coupled to said instruction unit; and one or more execution units coupled to said dispatch unit, wherein said translation circuit further comprises a content addressable memory ("CAM") including:

circuitry for receiving first and second numbers, A and B;

circuitry for determining if A+B matches with a third number K stored in said CAM without adding A and B together, wherein A+B represents a binary addition of A and B; and circuitry for using K to select and output a fourth number from said CAM, wherein said determining circuitry further comprises:

circuitry for encoding A and B into a plurality of M bits, which are a redundant representation of A+B; and circuitry for comparing said M bits with K to determine if there is a match.

17. The microprocessor as recited in claim 16, wherein A, B, and K have i+1 bits each, wherein said determining circuitry further comprises for each bit i:

circuitry for computing said plurality of M bits as a function of $A_i$, $B_i$, $A_{i+1}$, $B_{i+1}$ and their complements.

18. The microprocessor as recited in claim 17, wherein said comparing circuitry further comprises:

circuitry for ANDing said plurality of M bits with logical combinations of $K_i$ and $K_{i+1}$ and their complements.

19. The microprocessor as recited in claim 18, wherein A and B represent an effective address.

20. The microprocessor as recited in claim 17, wherein the computing circuitry further comprises:

a first NAND gate receiving $A_i$ and $B_i$;

a second NAND gate receiving the complements of $A_i$ and $B_i$;

a third NAND gate receiving $A_i$ and the complement of $B_i$;

a fourth NAND gate receiving $B_i$ and the complement of $A_i$;

a fifth NAND gate receiving outputs of the first and second NAND gates;

a sixth NAND gate receiving outputs of the third and fourth NAND gates;

a seventh NAND gate receiving a sum of a complement of $A_{i+1}$ and a complement of $B_{i+1}$ and an output of the fifth NAND gate;

an eighth NAND gate receiving a logical AND of $A_{i+1}$ and $B_{i+1}$ and an output of the fifth NAND gate;

a ninth NAND gate receiving the logical AND of $A_{i+1}$ and $B_{i+1}$ and the output of the fifth NAND gate;

a tenth NAND gate receiving a sum of $A_{i+1}$ and $B_{i+1}$ and the output of the fifth NAND gate;

an eleventh NAND gate receiving the logical AND of $A_{i+1}$ and $B_{i+1}$ and an output of sixth NAND gate;

a twelfth NAND gate receiving the sum of $A_{i+1}$ and $B_{i+1}$ and the output of the sixth NAND gate;

a thirteenth NAND gate receiving the sum of the complement of $A_{i+1}$ and the complement of $B_{i+1}$ and the output of the sixth NAND gate;

a fourteenth NAND gate receiving the logical AND of $A_{i+1}$ and $B_{i+1}$ and the output of the sixth NAND gate;

a fifteenth NAND gate receiving outputs of the seventh and eleventh NAND gates;

a sixteenth NAND gate receiving outputs of the eighth and twelfth NAND gates;

a seventeenth NAND gate receiving outputs of the ninth and thirteenth NAND gates; and an eighteenth NAND gate receiving outputs of the tenth and fourteenth NAND gates, wherein the fifteenth, sixteenth, seventeenth, and eighteenth NAND gates output the plurality of M bits.

21. The microprocessor as recited in claim 16, wherein the comparing circuitry further comprises:

a memory for storing K;

a first AND gate receiving K from the memory cell and K from an adjacent memory cell;

a second AND gate receiving K from the memory cell and a complement of K from the adjacent memory cell;

a third AND gate receiving a complement of K from the memory cell and K from the adjacent memory cell;

a fourth AND gate receiving the complement of K from the memory cell and the complement of K from the adjacent memory cell;

a fifth AND gate receiving a second one of the M bits and an output of the second AND gate;

a sixth AND gate receiving a third one of the M bits and an output of the third AND gate; and a seventh AND gate receiving a fourth one of the M bits and an output of the fourth AND gate.

22. The microprocessor as recited in claim 16, wherein said third number K is not predetermined to be of a specific single value.

23. The microprocessor as recited in claim 16, wherein said third number K is not known before the determination if A+B matches with the third number K stored in said CAM without adding A and B together.

24. The microprocessor as recited in claim 16, wherein K may have any one of $2^N$ possible values, wherein K is an N-bit number.

25. A content addressable memory ("CAM") comprising:

circuitry for receiving first and second numbers, A and B;

circuitry for determining if A+B matches with a third number K stored in said CAM without adding A and B together; and circuitry for using K to select and output a fourth number from said CAM, wherein said determining circuitry further comprises:

circuitry for encoding A and B into a plurality of M bits, which are a redundant representation of A+B; and circuitry for comparing said M bits with K to determine if there is a match, wherein the comparing circuitry further comprises:

a memory for storing K, a first AND gate receiving K from the memory cell and K from an adjacent memory cell, a second AND gate receiving K from the memory cell and a complement of K from the adjacent memory cell;

a third AND gate receiving a complement of K from the memory cell and K from the adjacent memory cell;

a fourth AND gate receiving the complement of K from the memory cell and the complement of K from the adjacent memory cell;

a fifth AND gate receiving a second one of the M bits and an output of the second AND gate;

a sixth AND gate receiving a third one of the M bits and an output of the third AND gate; and a seventh AND gate receiving a fourth one of the M bits and an output of the fourth AND gate.

26. A content addressable memory ("CAM") comprising:

circuitry for receiving first and second numbers, A and B, circuitry for determining if A+B matches with a third number K stored in said CAM without adding A and B together; and circuitry for using K to select and output a fourth number from said CAM, wherein said determining circuitry further comprises:

circuitry for encoding A and B into a plurality of M bits, which are a redundant representation of A+B; and circuitry for comparing said M bits with K to determine if there is a match, wherein the plurality of M bits are computed as follows:

$M_{11}^{i} = \overline{(A_i \oplus B_i)} \cdot (\overline{A}_{i+1} \vee B_{i+1}) \vee (A_i \oplus B_i) \cdot (A_{i+1} \cdot B_{i+1})$, $M_{10}^{i} = (A_i \oplus B_i) \cdot (A_{i+1} \vee B_{i+1}) \vee \overline{(A_i \oplus B_i)} \cdot (\overline{A}_{i+1} \cdot \overline{B}_{i+1})$, $M_{01}^{i} = (A_i \oplus B_i) \cdot (\overline{A}_{i+1} \cdot \overline{B}_{i+1}) \vee \overline{(A_i \oplus B_i)} \cdot (A_{i+1} \cdot B_{i+1})$, and $M_{00}^{i} = \overline{(A_i \oplus B_i)} \cdot (A_{i+1} \vee B_{i+1}) \vee (A_i \oplus B_i) \cdot (\overline{A}_{i+1} \cdot \overline{B}_{i+1})$.

* * * * *

UNITED STATES PATENT AND TRADEMARK OFFICE
CERTIFICATE OF CORRECTION

PATENT NO. : 6,161,164
DATED : December 12, 2000
INVENTOR(S) : Sang Hoo Dhong and Joel Abraham Silberman It is certified that error appears in the above-identified patent and that said Letters Patent is hereby corrected as shown below:

Column 2,
Lines 63-64, replace "Evaluation of A+B=K Conditions Without Carry Propagation," with -- Evaluation of A+B=K Conditions Without Carry Propagation, --
Lines 65-66, replace "Comments on 'Evaluation of A+B=K Conditions Without Carry Propagation'" with -- Comments on 'Evaluation of A+B=K Conditions Without Carry Propagation' --

Column 3,
Line 40, replace "$S_i = A_i \oplus B_i \oplus \overline{K_i} = K_i \cdot (A_i \oplus B_i) \sqrt{\overline{K_i}} \cdot \overline{(A_i \oplus B_i)}$ and"
with -- $S_i = A_i \oplus B_i \oplus \overline{K_i} = K_i \cdot (A_i \oplus B_i) \vee \overline{K_i} \cdot \overline{(A_i \oplus B_i)}$ and--

Line 41, replace "$C_i = A_i \cdot B_i \sqrt{\overline{K_i}} \cdot (A_i \sqrt{} B_i),$" with -- $C_i = A_i \cdot Bi \vee \overline{K_i} \cdot (A_i \vee B_i),$ --

Line 43, replace "$Z_i = K_i \cdot K_{i+1} \cdot M_{11}^i \sqrt{} K_i \cdot \overline{K}_{i+1} \cdot M_{10}^i \sqrt{\overline{K_i}} \cdot K_{i+1} \cdot M_{01}^i \sqrt{\overline{K_i}} \cdot \overline{K}_{i+1} \cdot M_{00}^i,$ where"
with -- $Z_i = K_i \cdot K_{i+1} \cdot M_{11}^i \vee K_i \cdot \overline{K}_{i+1} \cdot M_{10}^i \vee \overline{K_i} \cdot K_{i+1} \cdot M_{01}^i \vee \overline{K_i} \cdot \overline{K}_{i+1} \cdot M_{00}^i,$ where--

Lines 45 through 49, replace

"$M_{11}^i = \overline{(A_i \oplus B_i)} \cdot (\overline{A}_{i+1} \sqrt{} B_{i+1}) \sqrt{} (A_i \oplus B_i) \cdot (A_{i+1} \cdot B_{i+1}),$ $M_{10}^i = (A_i \oplus B_i) \cdot (A_{i+1} \sqrt{} B_{i+1}) \sqrt{\overline{(A_i \oplus B_i)}} \cdot (\overline{A}_{i+1} \cdot \overline{B}_{i+1}),$ $M_{01}^i = (A_i \oplus B_i) \cdot (\overline{A}_{i+1} \cdot \overline{B}_{i+1}) \sqrt{\overline{(A_i \oplus B_i)}} \cdot (A_{i+1} \cdot B_{i+1}),$ and $M_{00}^i = \overline{(A_i \oplus B_i)} \cdot (A_{i+1} \sqrt{} B_{i+1}) \sqrt{} (A_i \oplus B_i) \cdot (\overline{A}i+1 \cdot \overline{B}_{i+1}).$"

with -- $M_{11}^i = \overline{(A_i \oplus B_i)} \cdot (\overline{A}_{i+1} \vee \overline{B}_{i+1}) \vee (A_i \oplus B_i) \cdot (A_{i+1} \cdot B_{i+1}),$ $M_{10}^i = (A_i \oplus B_i) \cdot (A_{i+1} \vee B_{i+1}) \vee \overline{(A_i \oplus B_i)} \cdot (\overline{A}_{i+1} \cdot \overline{B}_{i+1}),$ $M_{01}^i = (A_i \oplus B_i) \cdot (\overline{A}_{i+1} \cdot \overline{B}_{i+1}) \vee \overline{(A_i \oplus B_i)} \cdot (A_{i+1} \cdot B_{i+1}),$ and $M_{00}^i = \overline{(A_i \oplus B_i)} \cdot (A_{i+1} \vee B_{i+1}) \vee (A_i \oplus B_i) \cdot (\overline{A}_{i+1} \cdot \overline{B}_{i+1}).$ --

Line 51, replace "$M_{jk}^i$" with -- $M_{jk}^i$ --

Line 67, replace "$M_{00}^i, M_{01}^i, M_{11}^i, M_{10}^i$" with -- $M_{00}^i, M_{01}^i, M_{11}^i, M_{10}^i$ --

UNITED STATES PATENT AND TRADEMARK OFFICE
CERTIFICATE OF CORRECTION

PATENT NO.   : 6,161,164
DATED        : December 12, 2000
INVENTOR(S)  : Sang Hoo Dhong and Joel Abraham Silberman It is certified that error appears in the above-identified patent and that said Letters Patent is hereby corrected as shown below:

Column 4,
Line 49, replace "$M_{jk}{}^{i}$" with -- $M_{jk}^{i}$ --

Column 5,
Line 56, after "B" replace "," with -- ; --

Column 7,
Line 17, after "together" replace "," with -- ; --

Column 8,
Lines 33 and 34-35, replace "$A_i$ and $B_i$ ;" with -- Ai and Bi; --
Lines 36-37, replace "$A_i$ and the complement of $B_i$ ;" with -- Ai and the complement of Bi; --
Lines 38-39, replace "$B_i$ and the complement of $A_i$;" with -- Bi and the complement of Ai; --
Lines 45 and 58, replace "$A_{i+1}$ and the complement of $B_{i+1}$" with -- Ai+1 and the complement of Bi+1 --
Lines 47-48, 49-50, 51, 53-54, 55 and 61, replace "$A_{i+1}$ and $B_{i+1}$" with
-- Ai+1 and Bi+1 --

Column 9,
Line 35, replace "$2^N$" with -- 2N --

UNITED STATES PATENT AND TRADEMARK OFFICE
CERTIFICATE OF CORRECTION

PATENT NO. : 6,161,164
DATED : December 12, 2000
INVENTOR(S) : Sang Hoo Dhong and Joel Abraham Silberman It is certified that error appears in the above-identified patent and that said Letters Patent is hereby corrected as shown below:

Column 10,
Lines 38-41, replace $$"M_{11}^i = \overline{(A_i \oplus B_i)} \cdot (\bar{A}_{i+1} \vee \bar{B}_{i+1}) \vee (A_i \oplus B_i) \cdot (A_{i+1} \cdot B_{i+1}),$$

$$M_{10}^i = (A_i \oplus B_i) \cdot (A_{i+1} \vee B_{i+1}) \vee \overline{(A_i \oplus B_i)} \cdot (\bar{A}_{i+1} \cdot \bar{B}_{i+1}),$$

$$M_{01}^i = (A_i \oplus B_i) \cdot (\bar{A}_{i+1} \cdot \bar{B}_{i+1}) \vee \overline{(A_i \oplus B_i)} \cdot (A_{i+1} \cdot B_{i+1}), \text{ and}$$

$$M_{00}^i = \overline{(A_i \oplus B_i)} \cdot (A_{i+1} \vee B_{i+1}) \vee (A_i \oplus B_i) \cdot (\bar{A}_{i+1} \cdot \bar{B}_{i+1})."$$

with $$-- M_{11}^i = \overline{(A_i \oplus B_i)} \cdot (\bar{A}_{i+1} \vee \bar{B}_{i+1}) \vee (A_i \oplus B_i) \cdot (A_{i+1} \cdot B_{i+1}),$$

$$M_{10}^i = (A_i \oplus B_i) \cdot (A_{i+1} \vee B_{i+1}) \vee \overline{(A_i \oplus B_i)} \cdot (\bar{A}_{i+1} \cdot \bar{B}_{i+1}),$$

$$M_{01}^i = (A_i \oplus B_i) \cdot (\bar{A}_{i+1} \cdot \bar{B}_{i+1}) \vee \overline{(A_i \oplus B_i)} \cdot (A_{i+1} \cdot B_{i+1}), \text{ and}$$

$$M_{00}^i = \overline{(A_i \oplus B_i)} \cdot (A_{i+1} \vee B_{i+1}) \vee (A_i \oplus B_i) \cdot (\bar{A}_{i+1} \cdot \bar{B}_{i+1}). --$$

Signed and Sealed this

Twenty-eighth Day of January, 2003

JAMES E. ROGAN
*Director of the United States Patent and Trademark Office*